United States Patent
Kozyrev et al.

(10) Patent No.: US 9,935,218 B2
(45) Date of Patent: Apr. 3, 2018

(54) GENERATION OF FLEXIBLE HIGH POWER PULSED WAVEFORMS

(71) Applicant: BAE Systems Information and Electronic Systems Integration Inc., Nashua, NH (US)

(72) Inventors: Alexander Kozyrev, Rockville, MD (US); John McGeehan, Washington, DC (US); Yannick Morel, Falls Church, VA (US)

(73) Assignee: BAE Systems Information and Electronic Systems Integreation Inc., Nashua, NH (US)

(*) Notice: Subject to any disclaimer, the term of this patent is extended or adjusted under 35 U.S.C. 154(b) by 203 days.

(21) Appl. No.: 14/588,467

(22) Filed: Jan. 2, 2015

(65) Prior Publication Data
US 2016/0197215 A1    Jul. 7, 2016

(51) Int. Cl.
H01L 31/0304 (2006.01)
H01L 31/09 (2006.01)
H03K 17/78 (2006.01)
H01L 31/08 (2006.01)

(52) U.S. Cl.
CPC ........ *H01L 31/03044* (2013.01); *H01L 31/08* (2013.01); *H03K 17/78* (2013.01); *Y02E 10/544* (2013.01)

(58) Field of Classification Search
CPC ............... H01L 31/03044; H01L 31/09; H01L 31/0304; H01L 31/08; H01L 31/10; H01L 31/101; H01L 31/102; H01L 31/105; H01L 31/1055; H01L 31/103; H01L 31/1035; H01S 5/042; H03K 17/78; Y02E 10/544
See application file for complete search history.

(56) References Cited

U.S. PATENT DOCUMENTS

| | | | | |
|---|---|---|---|---|
| 4,329,686 A * | 5/1982 | Mourou | ............. | G01S 7/282 324/95 |
| 4,477,817 A * | 10/1984 | Anderson | ............. | H03H 11/28 333/17.3 |
| 5,029,971 A | 7/1991 | Hunt et al. | | |
| 5,044,714 A * | 9/1991 | Taylor | ............. | H03K 17/78 359/241 |
| 5,185,586 A * | 2/1993 | Zucker | ............. | H01Q 13/08 307/106 |
| 5,351,063 A * | 9/1994 | Kim | ............. | H01Q 9/27 343/701 |
| 5,804,815 A | 9/1998 | Loubriel et al. | | |
| 7,633,182 B2 | 12/2009 | London | | |
| 7,727,874 B2 | 6/2010 | Hanser et al. | | |
| 7,989,987 B2 * | 8/2011 | McDonald | ............. | H03K 3/57 307/106 |
| 8,563,930 B2 * | 10/2013 | Harris | ............. | H03C 1/34 250/200 |
| 2003/0042404 A1 * | 3/2003 | Rice | ............. | H01L 31/0304 250/214.1 |

(Continued)

OTHER PUBLICATIONS

Weiner et al., US SIR H000695, Oct. 3, 1989.

*Primary Examiner* — John Lee
(74) *Attorney, Agent, or Firm* — Hayes Soloway Maine Cernota & Rardin

(57) ABSTRACT

A method for generating high power pulsed RF waveforms comprises the steps of charging a transmission line in a pulse forming network with a high-voltage and discharging the voltage on the transmission line to ground utilizing a gallium nitride photoconductive switch.

24 Claims, 9 Drawing Sheets

(56) References Cited

U.S. PATENT DOCUMENTS

| | | | | |
|---|---|---|---|---|
| 2007/0092812 A1* | 4/2007 | Caporaso | H01L 31/09 | 430/57.7 |
| 2008/0007356 A1* | 1/2008 | Zucker | H03B 11/02 | 331/96 |
| 2008/0224794 A1* | 9/2008 | London | H04L 25/0278 | 333/20 |
| 2008/0284276 A1* | 11/2008 | McDonald | B82Y 30/00 | 310/308 |
| 2009/0261258 A1* | 10/2009 | Harris | H03C 1/34 | 250/370.01 |
| 2010/0001807 A1* | 1/2010 | London | H03K 3/53 | 333/20 |
| 2010/0282949 A1* | 11/2010 | Caporaso | H01L 31/09 | 250/214 SW |
| 2011/0101891 A1* | 5/2011 | Caporaso | H05H 7/00 | 315/501 |
| 2011/0198515 A1* | 8/2011 | Wraback | G02F 2/004 | 250/504 R |
| 2011/0254607 A1* | 10/2011 | London | H03K 3/86 | 327/291 |
| 2013/0334537 A1* | 12/2013 | Helava | H01L 31/162 | 257/76 |
| 2013/0342306 A1* | 12/2013 | Sampayan | H01C 1/00 | 338/15 |
| 2014/0038321 A1* | 2/2014 | Caporaso | H01L 31/09 | 438/24 |
| 2014/0284451 A1* | 9/2014 | Sampayan | H03C 1/34 | 250/206 |
| 2014/0363123 A1* | 12/2014 | Caporaso | G02B 1/005 | 385/16 |
| 2015/0048306 A1* | 2/2015 | Myers | H01L 33/32 | 257/13 |
| 2015/0187970 A1* | 7/2015 | Curry | H01L 31/03044 | 250/552 |
| 2015/0221804 A1* | 8/2015 | Curry | H01L 31/0224 | 257/431 |
| 2016/0197215 A1* | 7/2016 | Kozyrev | H01L 31/03044 | 250/214 SW |

* cited by examiner

GENERATION OF FLEXIBLE HIGH POWER PULSED WAVEFORMS

FIELD OF DISCLOSURE

This invention relates to the generation of flexible, high power pulsed waveforms, and more particularly to the utilization of a gallium nitride photoconductive switch to achieve this flexibility.

BACKGROUND OF THE DISCLOSURE

Electronic warfare involves a generation of high-power RF pulses which are incident on target radars/receivers so as to either result in jamming or to in fact cause massive malfunctions of the receiving apparatus. It has been the goal of those involved in electronic warfare to be able to put a considerable amount of energy on a target and to tailor the energy both in frequency and in pulse repetition rate to match that of the target's vulnerabilities. Target radars are now considerably more sophisticated and operate on the basis of coded signatures so as to be able to defeat jamming systems by being able to filter out indiscriminate jamming that doesn't take into account the sophistication of the target radar. Also, in communication systems, it is often times required to be able to disable these systems by the infusion of RF energy that causes these systems to malfunction.

In order to confuse or disable target receivers or electronics, be they microwave radars, or other types of communication systems, it is common to provide high power RF pulses generated by photoconductive switch-based RF generators. The present switch-based RF generators utilize silicon-based switches which are activated by pulsed lasers, the laser pulses of which serve to close the switches. The closing of the switch in general grounds a transmission line that has been charged from a high-voltage source, with the grounding of the transmission line causing a negative going RF pulse to be generated.

Thus, generation of high power pulsed RF waveforms has in the past been accomplished through the momentary grounding of a transmission line which is coupled to a high-voltage source, in which the grounding of the cable produces a negative going voltage spike that creates an RF waveform which propagates out through an antenna.

As mentioned above, this momentary grounding has been provided through silicon switch technology. The problem with such silicon technology is primarily the long carrier lifetime which limits the repetition rate and thus the frequency of the RF output as well as the ability to specifically tailor the outgoing RF waveform. Moreover, silicon technology has a limited voltage holding capability that limits output power and also offers only a limited tuning capability. Thus, photoconductive switch-based RF waveform generators based on silicon are limited to frequencies in the kilohertz pulse repetition rate range and are further restricted by the limits on the high-voltage supply.

Additionally, the silicon-based photoconductive switch RF generators are not capable of putting enough energy on a target unit, either because the RF output pulses are not powerful enough or because these systems cannot rapidly fire RF pulses on target. With silicon technology the building up of pulses to be fired in rapid succession on a target is simply not possible. For instance, it is not possible, utilizing silicon switches, to generate multiple high-power pulses in a single, rapid burst.

It will be appreciated that a single laser pulse applied to a silicon switch closes the switch for tens to hundreds of microseconds due to the long carrier lifetime associated with silicon, with the switch closure completely discharging a transmission line due to the long switch closure. Since there is no further charge in the transmission line this precludes multiple high-power RF pulses generated during the time it takes the silicon switch to recover. The result is that when one uses silicon switch technology only a single high-powered RF pulse can be generated once every 10 to 100 µs.

Further, due to the fact that only a single output pulse can be generated with silicon switching systems every 10 to 100 µs, there is no possibility to provide additional laser shots within this 10 to 100 µs silicon switch recovery time, i.e. prior to the completion of the initial transmission line discharge phase.

SUMMARY OF THE DISCLOSURE

Embodiments of the present disclosure provide a system and method for a waveform flexible photoconductive switch-based high power RF pulse generator having a photoconductive switch with a sub-nanosecond response time. Briefly described, in architecture, one embodiment of the system, among others, can be implemented as follows. A gallium nitride photoconductive switch is provided. A laser is provided for activating said gallium nitride photoconductive switch. An RF pulse forming network including a transmission line is connected to said gallium nitride photoconductive switch, wherein activation of the switch discharges said transmission line to ground. A high-voltage source is coupled to said gallium nitride photoconductive switch.

The present disclosure can also be viewed as providing a method for generating high power pulsed RF waveforms. In this regard, one embodiment of such a method, among others, can be broadly summarized by the following steps: charging a transmission line in a pulse forming network with a high-voltage; and discharging the voltage on the transmission line to ground utilizing a gallium nitride photoconductive switch.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
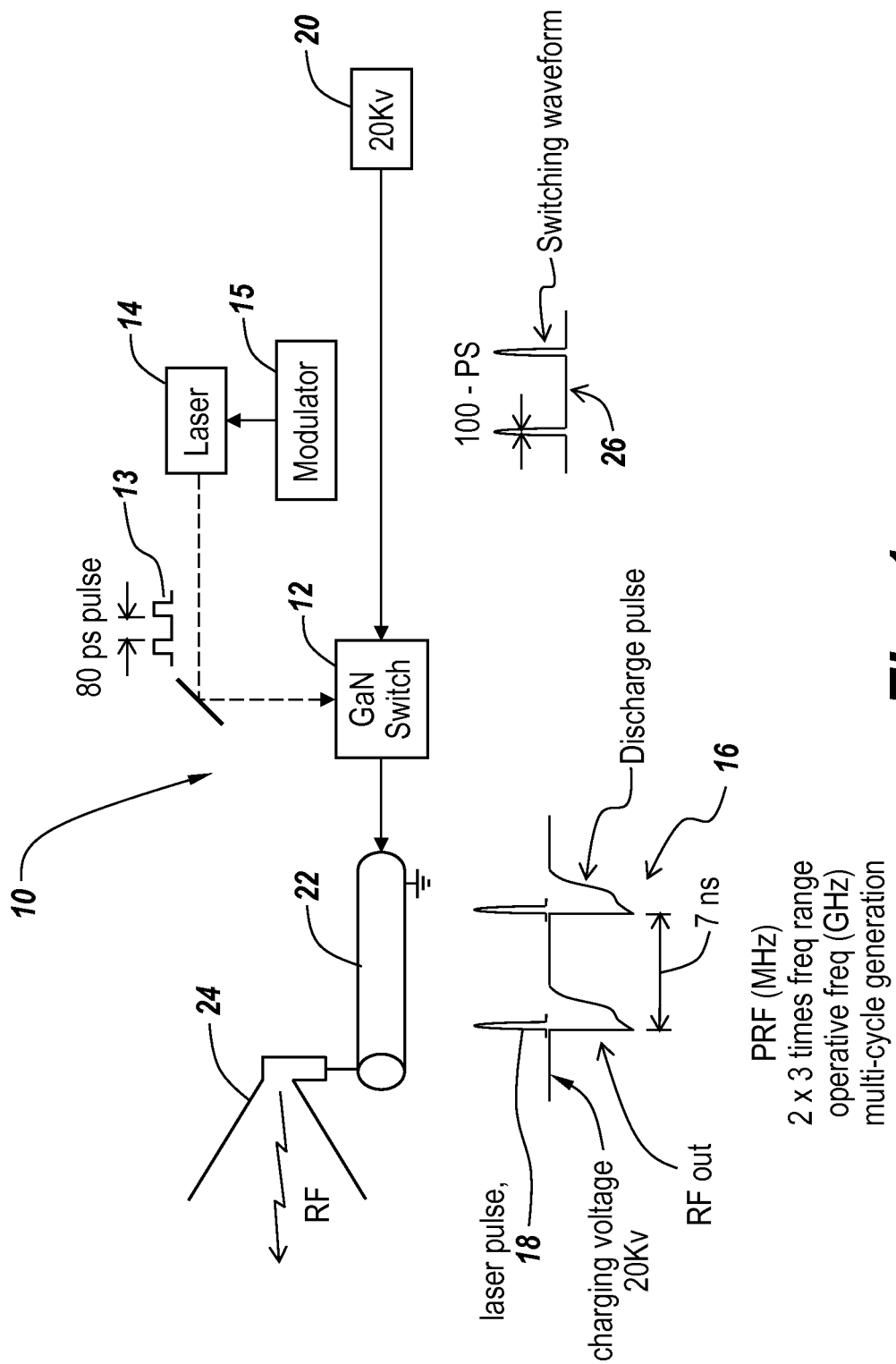
FIG. 1 is a diagrammatic illustration of a gallium nitride switch utilized in a high-power pulsed RF waveform photoconductive switch-based RF generator, showing the keying of a gallium nitride switch from laser pulses that result in the production of nanosecond negative going RF output pulses, in accordance with a first embodiment of the present disclosure.

In order to provide a waveform flexible photoconductive switch-based RF generator, the photoconductive switch is a sub nanosecond response time switch based on gallium nitride technology which has as its primary characteristic short carrier lifetimes, as well as substantially increased voltage holding. This in turn results in the ability to tune the RF waveform over relatively wide frequency range. Moreover, the moderate on—resistance characteristic of the gallium nitride is overcome by the 20 kV capability of the switch. Because of the physics within the gallium nitride crystal, one can rapidly switch 100,000 times faster than a silicon switch so that one can manage to change the frequency that comes out without having to change the transformer utilized between the pulse generator and an associated antenna.

Because of the ability to rapidly cycle the gallium nitride switch, it is possible for a charged transmission line to be multiply discharged prior to the time that all the energy in the transmission line is used up. Thus, the short lifetime associated with gallium nitride results in a single quick discharge pulse so that the transmission line remains charged for a new pulse, resulting in high repetition rates. This permits rapid high power pulse generation to produce multiple high-power pulses on a target, the ability to generate gigahertz operating frequencies, the ability to provide pulse repetition rates as high as 1 GHz that can match those of target radars, the ability to change the operating frequency with different interpulse phasing of the laser pulses utilized to trigger the switch, the ability to tailor the RF waveform and the ability to modulate the RF waveform through modulation of the laser.

Due to the fact that gallium arsenide combines high voltage holding capability with very short lifetimes, the short carrier lifetimes allow direct modulation of the switch resistance by fast optical pulses resulting in high repetition rate RF generation, tuning of the output waveform, a higher operating frequency as compared to systems utilizing silicon switches and multi-cycle generation, with a single switch to be able to tailor the characteristics of the RF output waveform. Since multiple switch closures can be made to occur before the transmission line is completely discharged, this allows for multiple RF pulse outputs and waveform shaping or frequency tuning, as well as an RF output modulated by the laser pulses utilized to actuate the switch.

Now it is possible to get around the characteristics of the silicon technology by providing a switch with exceedingly short carrier lifetimes, thus achieving high pulse repetition rates in the tens of megahertz and to tune the output waveform by repeatedly discharging a charged transmission line with multiple laser pulses prior to depleting all of the charged capacity in the transmission line.

The ability to generate multiple RF pulses in rapid succession increases the amount of energy on a target, increases the pulse repetition rate so as to match that of a target, provides gigahertz operational frequencies, and increases the tuning range of the RF generator by 5 to 10 times over that achievable utilizing silicon switch technology, allowing tuning to match target vulnerabilities from a single source.

In summary, a gallium nitride photoconductive switch-based RF generator is provided with waveform flexibility to accommodate different missions, goals and targets that have different effective RF waveforms and varying frequency, power and repetition rate characteristics. Due to the utilization of gallium nitride as the sub-nanosecond response time switching element, the subject RF generator is flexible, scalable and applicable to multi-application system design.

FIG. 1 is a diagrammatic illustration of a gallium nitride switch utilized in a high-power pulsed RF waveform photoconductive switch-based RF generator, showing the keying of a gallium nitride switch from laser pulses that result in the production of nanosecond negative going RF output pulses, in accordance with a first embodiment of the present disclosure. As shown, a gallium nitride switch 12 is utilized in a high-power pulsed RF waveform photoconductive switch-based RF generator 10, in which the gallium nitride switch is keyed by laser pulses 13 from a laser 14 under the control of a modulator 15 that results in the production of negative going RF output pulses 16 separated by nanoseconds. In one embodiment, one or more 80 ps output pulses 13 are used to key the switch. It can be seen that laser pulses 13 result in the negative going output pulses 16. How this is accomplished is as follows.

A high-voltage source 20, in one embodiment, a 20 kV voltage, is coupled to switch 12, which is in turn coupled to a transmission line 22, in turn coupled to a microwave horn 24. In one embodiment, the transmission line is a coaxial transmission line which is grounded as illustrated. Note, as illustrated at 26, the switch gate-on times produced by the 80 picosecond laser pulses are in general 100 ps in width. This switching waveform in essence, results in the momentary grounding of the center conductor of the transmission line to discharge the voltage that has built up on the transmission line, with the discharge of the transmission line resulting in the negative going RF output pulses 16.

Figure 2A:
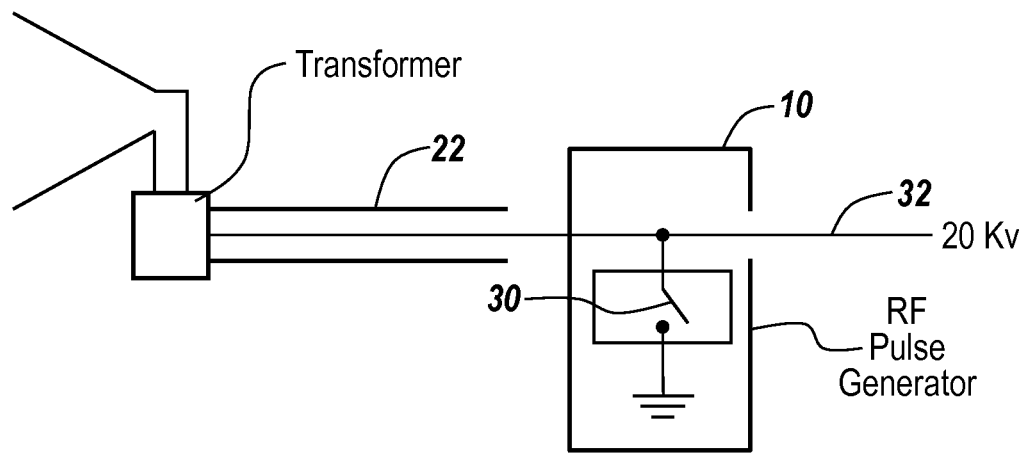
FIG. 2A is a diagrammatic illustration showing the activation of the switch for use in discharging a transmission line for the generation of an RF pulse, in accordance with a first embodiment of the present disclosure.

FIG. 2A is a diagrammatic illustration showing the activation of the switch for use in discharging a transmission line for the generation of an RF pulse, in accordance with a first embodiment of the present disclosure. Schematically shown by switch 30 is the grounding of a center conductor of transmission line 22 so as to provide for the discharge of the gallium nitride switch into a 50 ohm line to produce an output pulse. Here in the schematic diagram of the photoconductive switch 10, the switch is shown connected between the center conductor 32 of the charged transmission line 22, with the momentary grounding generating a negative going transient RF pulse with the closure of the switch As will be shown, if the switch can be actuated rapidly to discharge the voltage in the transmission line, it is possible to pulse the switch so that a number of negative going RF pulses can be generated prior to the time the energy stored in the transmission line is depleted. This means that a single switch can produce multiple RF output pulses without having to wait for the long reset times associated with silicon switches that precludes multiple rapid RF pulse generation. Note, with silicon switches, they remain closed until the entire transmission line has discharged. This severely limits the pulse repetition rate.

On the other hand, use of gallium nitride switches provides the opportunity to dramatically increase the operating frequency of the system, increase the pulse repetition frequency, and with the mixing of the pulses produced by the rapid keying of the switch, change the frequency of the output signal. Moreover, by proper phasing of the laser pulses various waveform characteristics and modulations are achievable. Thus, the subject high power pulse generator is readily adaptable to different missions, goals and targets that have different effective RF waveforms and varying frequency, and power requirements.

Figure 2B:
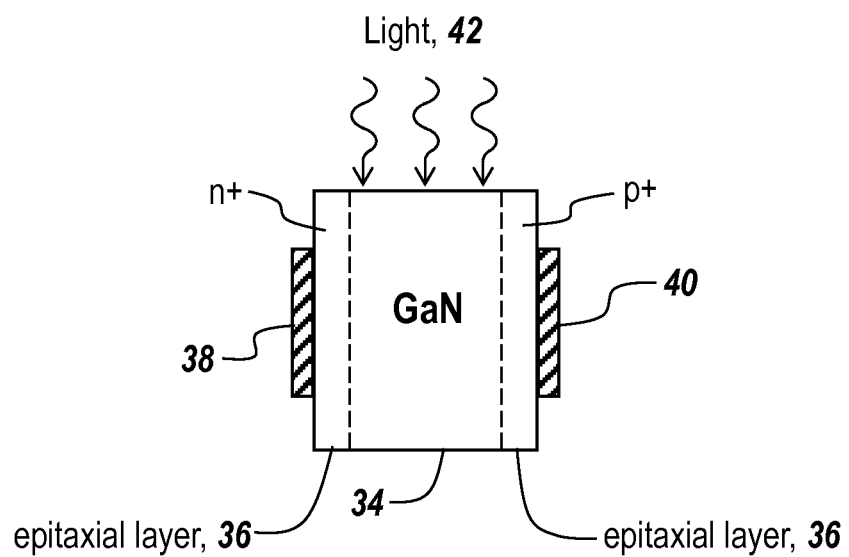
FIG. 2B is a diagrammatic illustration of a gallium nitride switch usable in the pulse generator of FIG. 1, in accordance with a first embodiment of the present disclosure.

FIG. 2B is a diagrammatic illustration of a gallium nitride switch usable in the pulse generator of FIG. 1, in accordance with a first embodiment of the present disclosure. It will be seen that a photoconductive gallium nitride switch can be formed through the utilization of a gallium nitride body 34 having epitaxial layers 36 to either side as shown. These epitaxial grown layers have an n+ conductivity type and p+ conductivity type respectively. To either side of these epitaxial regions, respectively, electrical contacts 38 and 40 are deposited, with light generally indicated by arrows, 42, serving to activate the switch.

The first reported high power photoconductive switch used in the generation of high-power RF pulses is shown in SIR H695 Weiner et al. issued Oct. 3, 1989 in which gallium arsenide material is used, which has a very high resistivity that has the capability to withstand high voltages. With laser illumination, this device can be activated with large amounts of optical energy incident on the switch. This switch is an optically activated bulk silicon pin diode, with improvements to the switch being detailed in U.S. Pat. Nos. 5,029,971; 5,804,815; 7,633,182; and 7,727, 874, none of which teach the use of gallium nitride.

It will be seen that when utilizing gallium nitride for the generation of a single RF pulse, the short carrier lifetime means that the switch can be activated on a nanosecond time scale. Moreover, due to the short carrier lifetime the transmission line is minimally discharged by a single 80 ps laser pulse. Thus, when the laser outputs multiple pulses it achieves a high repetition rate RF signal generation that only minimally discharges the transmission line.

Figure 2C:
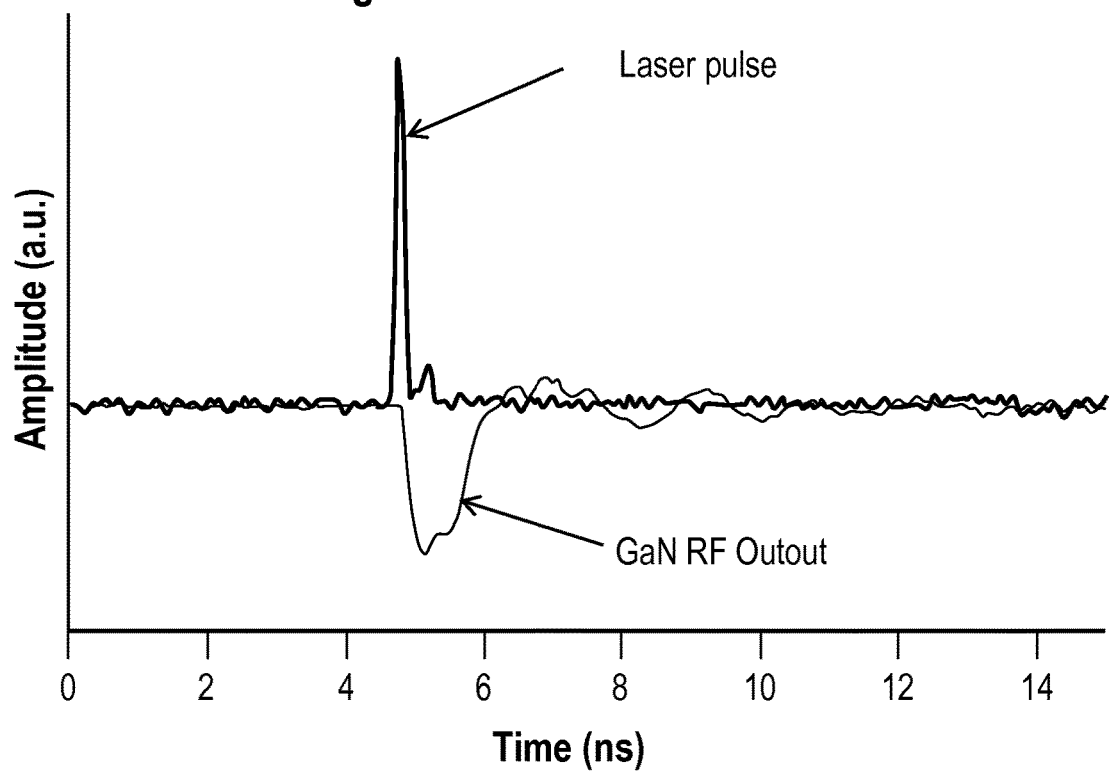
FIG. 2C is a graph of switch performance of a gallium nitride photoconductive switch showing a 1 nanosecond RF output pulse generated by the use of an 80 ps laser pulse, in accordance with a first embodiment of the present disclosure.

FIG. 2C is a graph of switch performance of a gallium nitride photoconductive switch showing a 1 nanosecond RF output pulse generated by the use of an 80 ps laser pulse, in accordance with a first embodiment of the present disclosure. What is shown is the discharge of a gallium nitride switch into a 50 ohm line with an 80 ps laser pulse. What is created is a negatively going discharge pulse of 1 ns. Note that the delay in switching is due to capacitance and connection inductance.

Due to the short lifetimes of the carriers in the gallium nitride switch, an exceedingly short laser pulse can generate a nanosecond closing of the gallium nitride switch, which permits the production of very short line discharge pulses. Thus, comparing gallium nitride photoconductive switches to carrier lifetime with silicon-based photoconductive switches, due to the long carrier lifetime of the silicon, there is a full discharge of the transmission line from a single 80 ps laser pulse. Thus, a silicon switch which is closed by an 80 ps laser pulse cannot be recycled until more than 60 ns of time has expired which limits the repetition rate of the high-power pulses generated by discharging the transmission line. On the other hand, the short lifetime of gallium nitride results in a single quick discharge pulse from the transmission line in response to a single 80 ps laser pulse in which the transmission line remains charged so that it can be again discharged by a new laser pulse. This results in a high repetition rate when using gallium nitride.

Note, the relatively high turn-on resistance of gallium nitride is offset by the higher charging voltages that can be used, and that the resistance of gallium nitride has been reduced by a factor of 10 in recent years as processing techniques mature. Note further that a single laser pulse on a silicon based switch closes the switch for tens to hundreds of microseconds in the case of silicon-based switches due to long carrier lifetime, and completely discharges a transmission line which, while allowing for a single high-powered RF pulse to be generated, has a limited pulse repetition rate. Due to the short carrier lifetimes of gallium nitride, a single 80 ps laser pulse on the switch closes it for only hundreds of picoseconds, partially discharging a transmission line, and allowing for rapid repetition of shots. The attached 20 kV source then can replenish the lost charge. The proper timing of these shots can offer RF flexibility in terms of high repetition rate RF generation in terms of tens of megahertz and the tuning of the output waveform to 5 to 10 times the tuning range when compared to silicon-based switches.

Figure 3:
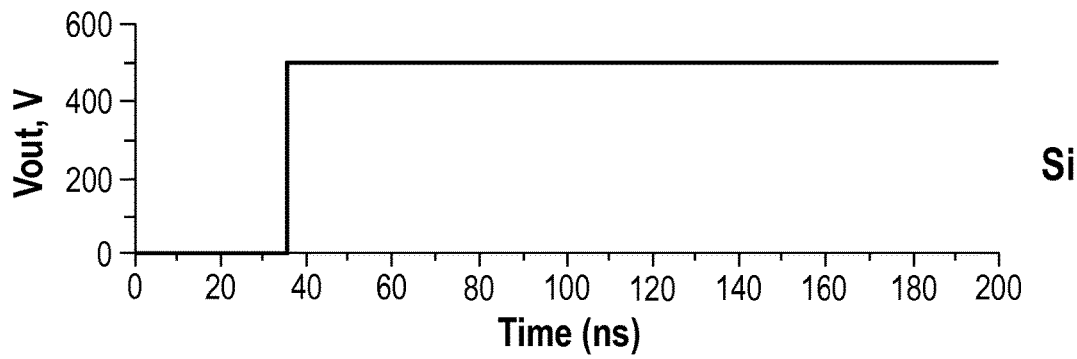
FIG. 3 is a is a graph of time versus voltage, showing the discharge of a charged transmission line through a silicon switch, showing that the switch remains closed for multiple microseconds corresponding to the long reset time of the silicon switch, in accordance with a first embodiment of the present disclosure.

FIG. 3 is a is a graph of time versus voltage, showing the discharge of a charged transmission line through a silicon switch, showing that the switch remains closed for multiple microseconds corresponding to the long reset time of the silicon switch, in accordance with a first embodiment of the present disclosure. What is shown is the discharge of the charged transmission line through a silicon based photoconductive switch. Here it can be seen that a single laser pulse causes the silicon switch to remain closed until the entire line is discharged. It will be seen that the silicon switch remains closed for multiple microseconds which results in a long reset time.

Figure 4:
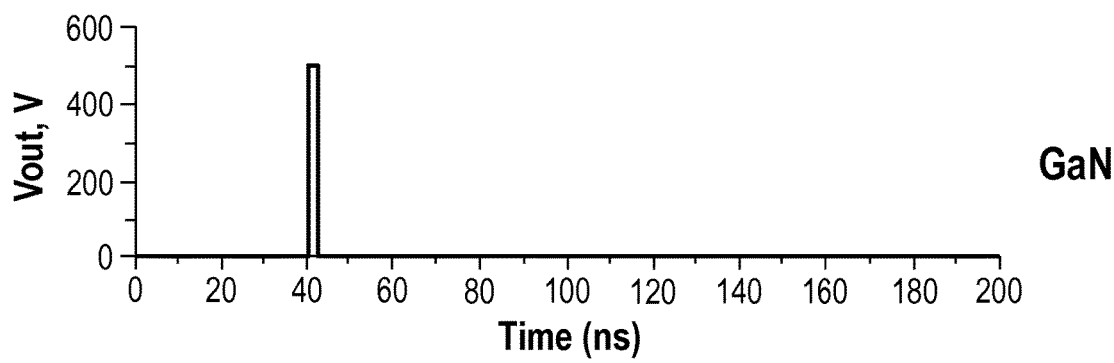
FIG. 4 is a graph showing a single narrow laser pulse that results in a single short RF pulse due to the short carrier lifetime in which the transmission line is minimally discharged by the laser pulse, in accordance with a first embodiment of the present disclosure.

FIG. 4 is a graph showing a single narrow laser pulse that results in a single short RF pulse due to the short carrier lifetime in which the transmission line is minimally discharged by the laser pulse, in accordance with a first embodiment of the present disclosure. In the case of gallium nitride, what is shown is that the discharge associated with a single RF pulse is exceedingly short due to the short carrier lifetime. The result is that the transmission line is minimally discharged with a single activation of the photoconductive switch with, for instance, an 80 ps laser pulse.

Figure 5:
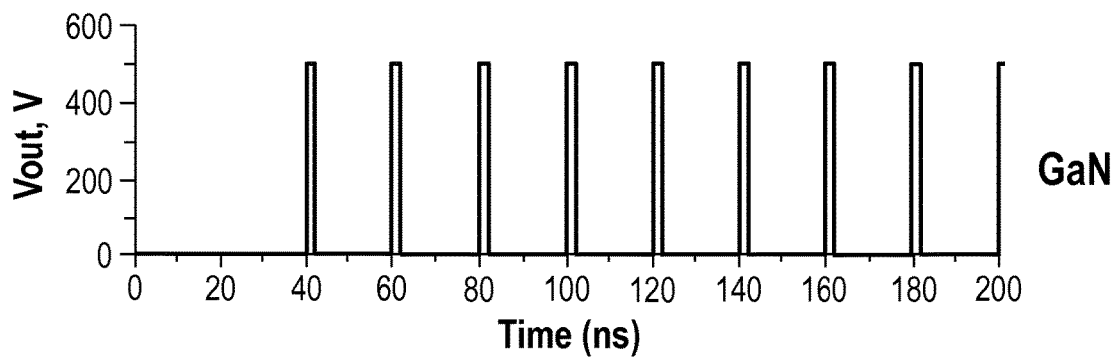
FIG. 5 is a graph showing repeated high repetition rate laser pulses to produce multiple output RF pulses having a high repetition rate in which the transmission line is not completely discharged by a laser pulse activation switch, in accordance with a first embodiment of the present disclosure.

FIG. 5 is a graph showing repeated high repetition rate laser pulses to produce multiple output RF pulses having a high repetition rate in which the transmission line is not completely discharged by a laser pulse activation switch, in accordance with a first embodiment of the present disclosure. If the gallium nitride switch is activated by multiple 80 ps laser pulses, the result is a high repetition rate for the generation of RF pulses which, while producing significant RF output power, does not deplete or discharge the charged transmission line with each pulsing of the switch.

Figure 6:
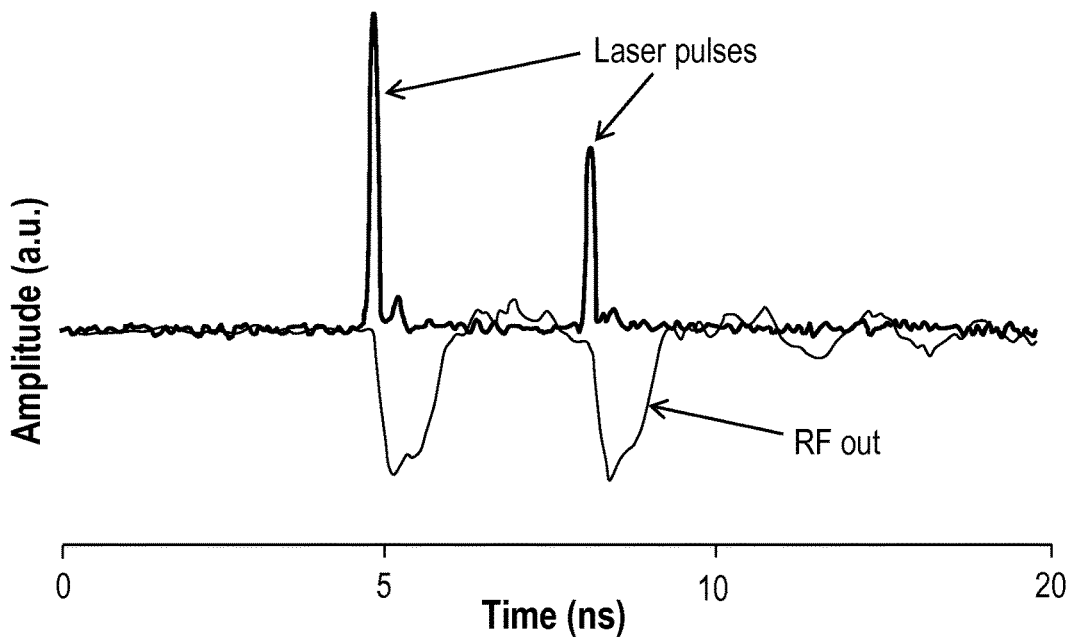
FIG. 6 is a graph showing gallium nitride switch line discharge for the generation of two RF pulses corresponding to the generation of two laser pulses applied to the switch, showing the corresponding nanosecond negative going RF output pulses separated by 7 ns, in accordance with a first embodiment of the present disclosure.

FIG. 6 is a graph showing gallium nitride switch line discharge for the generation of two RF pulses corresponding to the generation of two laser pulses applied to the switch, showing the corresponding nanosecond negative going RF output pulses separated by 7 ns, in accordance with a first embodiment of the present disclosure. What is shown is the result of a single gallium nitride photoconductive switch being pulsed by an 80 ps laser pulse which results in multiple negative going RF pulses being generated. These pulses are separated by, for instance, 7 ns and show that multiple pulses from a single charged line can be generated with a single high pulse repetition rate switch.

Figure 7:
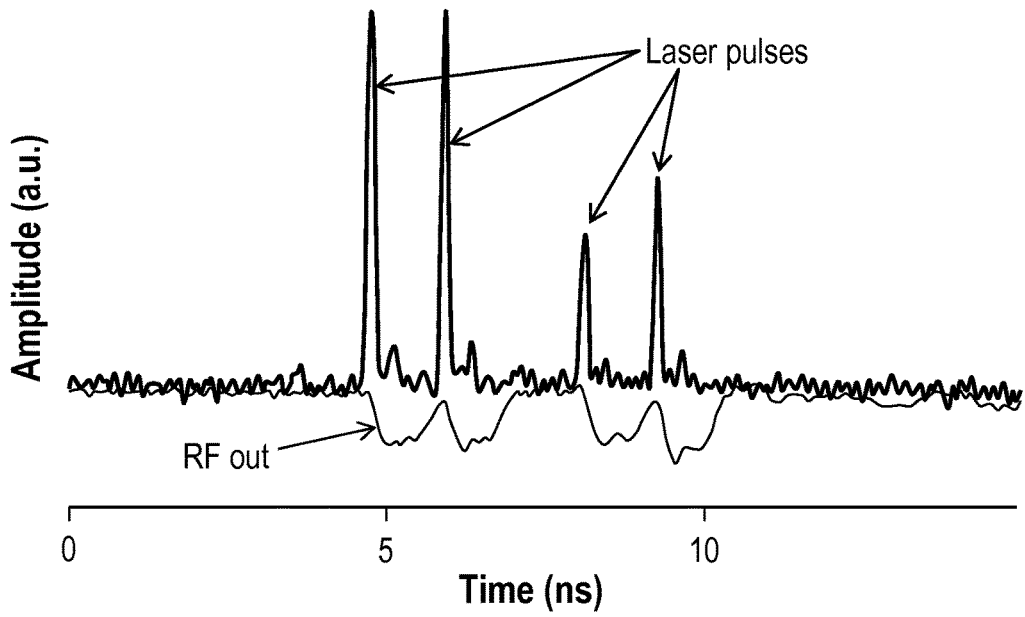
FIG. 7 is a graph showing gallium nitride switch line discharge for four laser pulses, showing the generation of four RF pulses from a single charge line, also showing additional laser shots prior to the completion of an initial pulse that can allow for waveform shaping, frequency tuning and gigahertz frequency operation in which the RF output can be modulated by the laser pulses, in accordance with a first embodiment of the present disclosure.

FIG. 7 is a graph showing gallium nitride switch line discharge for four laser pulses, showing the generation of four RF pulses from a single charge line, also showing additional laser shots prior to the completion of an initial pulse that can allow for waveform shaping, frequency tuning and gigahertz frequency operation in which the RF output can be modulated by the laser pulses, in accordance with a first embodiment of the present disclosure. What is shown is a gallium nitride switch line discharge resulting in the production of four pulses by four laser pulses activating the switch, with the additional laser pulses being applied to the switch prior to the completion of what is called the initial phase of the gallium nitride switch line discharge cycle. What this means is that the gallium nitride switch line retains its high-voltage potential that is not significantly decreased during the pulsing of the gallium nitride switch. This in turn allows for waveform shaping, frequency tuning, as well as the output modulated by the laser pulse.

The reason that this is possible is that the reset time for the gallium nitride switch is 10,000 times shorter than that associated with a silicon based switch. The net result for some target radars is that if they have a pulse repetition rate of 100,000 pulses per second, the subject system can match this pulse repetition rate and therefore establish the required electronic countermeasure function.

Moreover, disabling targets by just stacking multiple RF pulses on the target can in some instances disable the target by hammering it with a quick succession of pulses.

Figure 8:
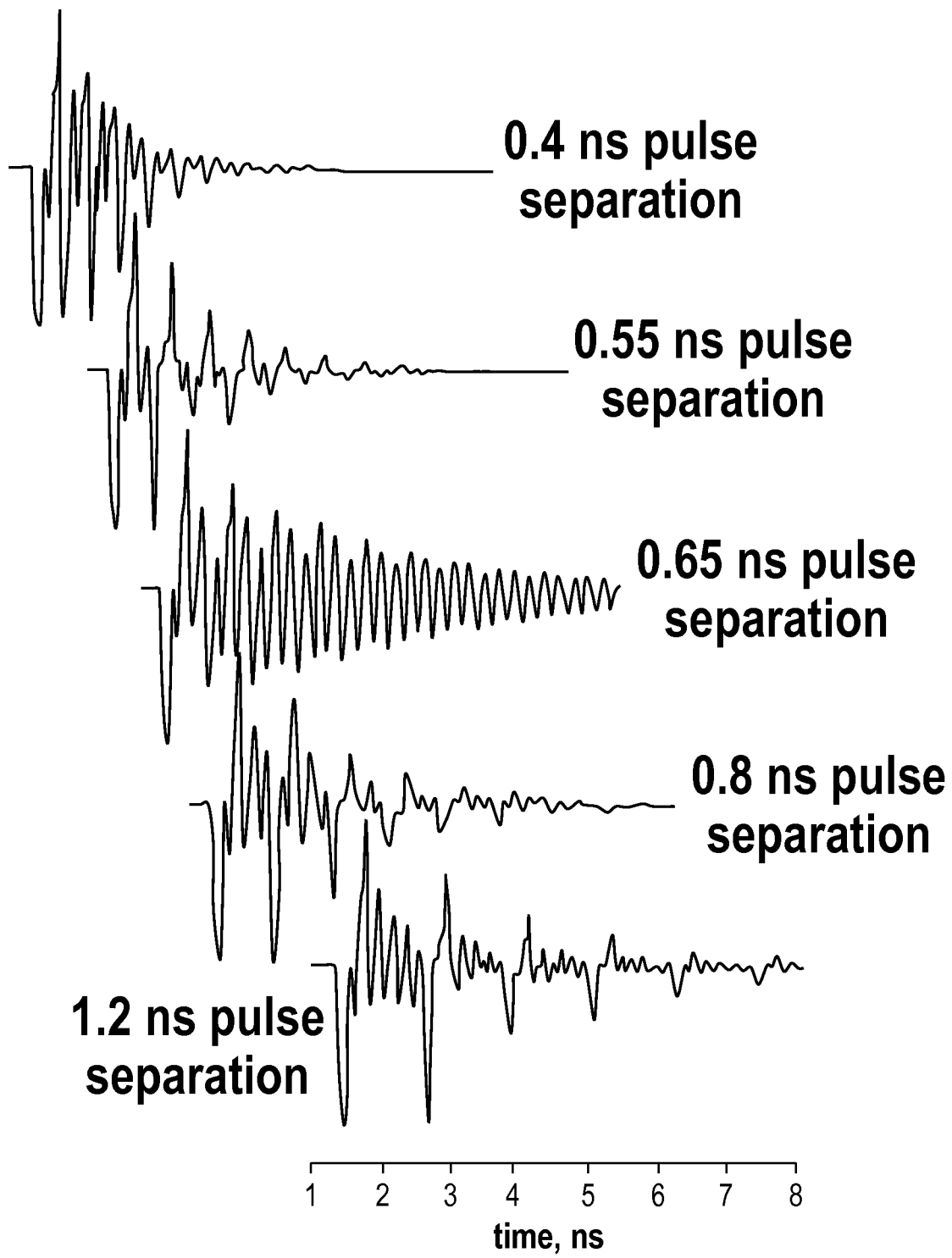
FIG. 8 is a diagrammatic illustration showing waveform generation for five different interpulse spacings, with the 0.4 ns, 0.55 ns, 0.65 ns, 0.8 ns and 1.2 ns pulse separations, resulting in five different frequencies for the output pulses, in accordance with a first embodiment of the present disclosure.
Figure 9:
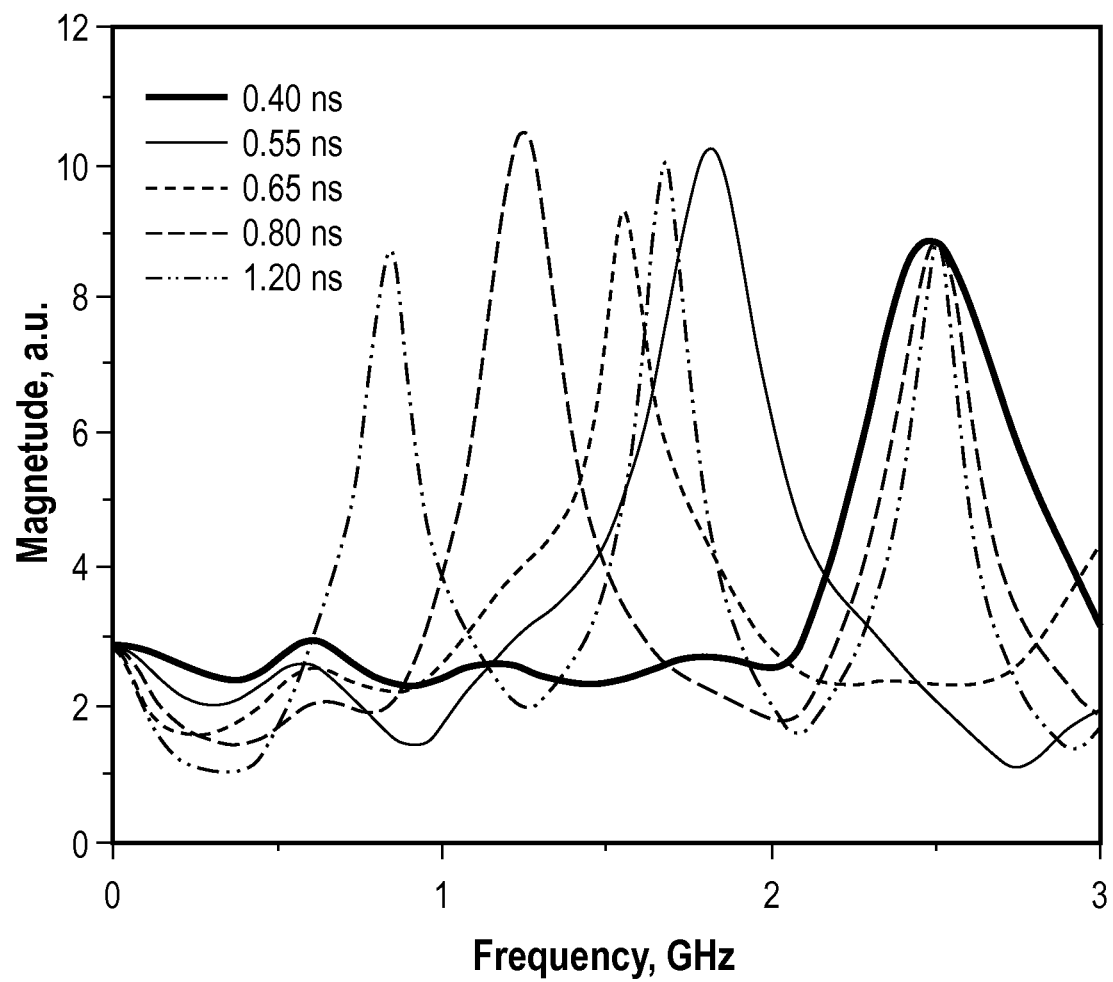
FIG. 9 is a graph showing frequency versus magnitude of the pulses generated by the different pulse separations shown in FIG. 8, in accordance with a first embodiment of the present disclosure.

FIG. 8 is a diagrammatic illustration showing waveform generation for five different interpulse spacings, with the 0.4 ns, 0.55 ns, 0.65 ns, 0.8 ns and 1.2 ns pulse separations, resulting in five different frequencies for the output pulses, in accordance with a first embodiment of the present disclosure. FIG. 9 is a graph showing frequency versus magnitude of the pulses generated by the different pulse separations shown in FIG. 8, in accordance with a first embodiment of the present disclosure. Referring now to FIGS. 8 and 9, what is shown is the ability to frequency tune the RF output of the switch by pulse mixing in the pulse forming network, as well as providing waveform shaping by multi-pulse generation in which, by changing the delay between laser pulses, generates a wide frequency tuning capability or provides multi-cycle, flexible waveform RF generation using a single switch.

Note, in standard pulse forming networks that include an impedance transformer which forms part of the pulse forming network, when utilizing silicon photoconductive switch technologies, every pulse that exits the network will be the same because every pulse leaves the network before the switch is activated again. This assumes a relatively large interpulse spacing due to the long carrier lifetimes of the silicon switches. However, if one could key the switch fast enough, then multiple pulses will add up in the pulse forming network before they exit the network. The net result is that the RF pulses adding up within the pulse forming network have an average frequency that can be made to change. Thus, the frequency of the outgoing RF signal can be made to change in accordance with the pulse separation between the laser pulses keying the gallium nitride switch when the resulting transient pulses overlie one another within the pulse forming network.

Figure 10:
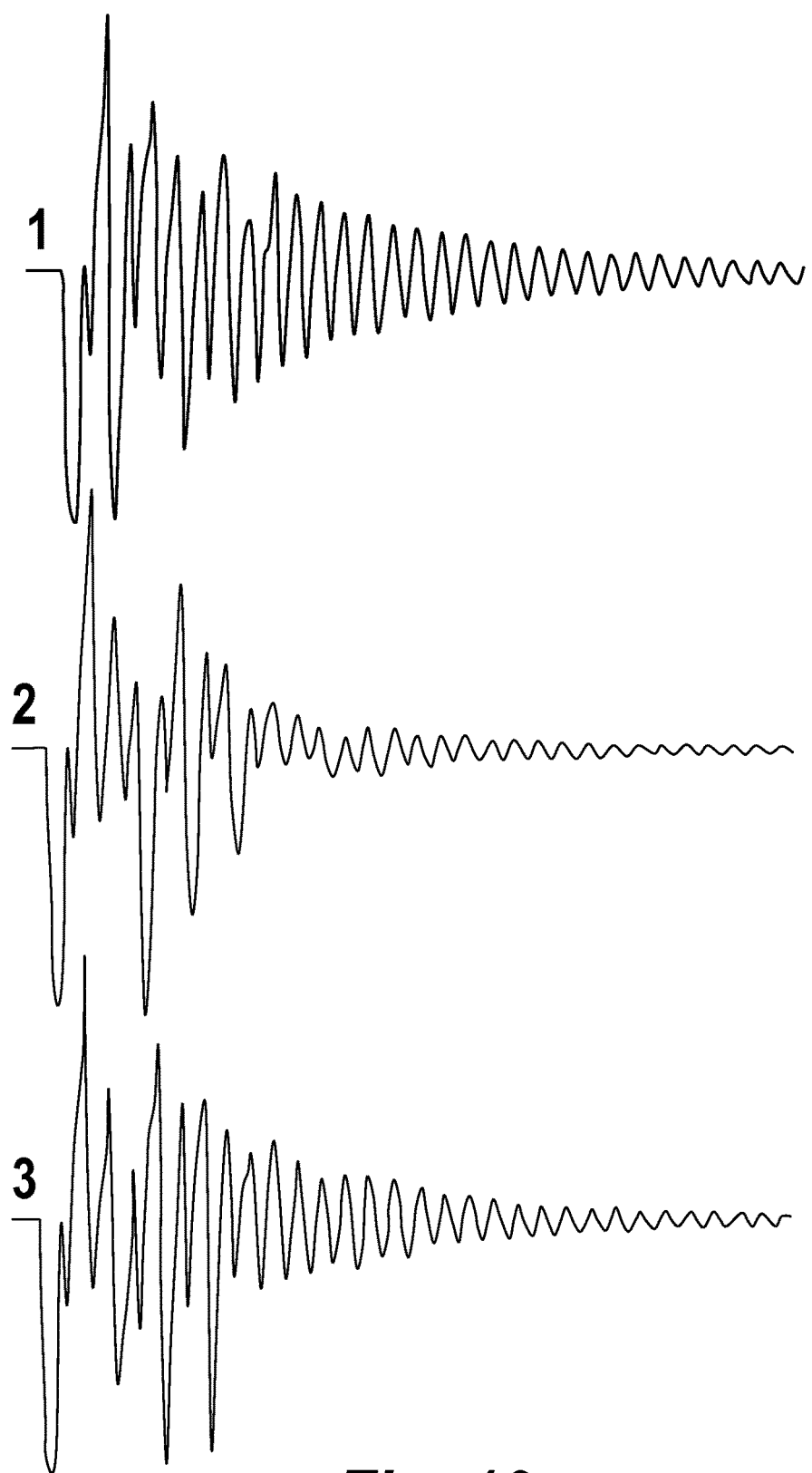
FIG. 10 is diagrammatic illustration showing waveform flexibility through the utilization of changing laser pulse spacing, showing the waveform generated, with three different laser pulse spacings, in accordance with a first embodiment of the present disclosure.

FIG. 10 is diagrammatic illustration showing of waveform flexibility through the utilization of changing laser pulse spacing, showing the waveform generated, with three different laser pulse spacings, in accordance with a first embodiment of the present disclosure. With nanosecond pulse separations of the laser pulses used to key the switch of 0.4, 0.55, 0.65, 0.8 and 1.2 ns, a first RF impulse wave train is generated, followed by a second, a third and a fourth, all of the RF pulses generated before the first pulse exits the pulse forming network. This means that while new pulses are entering the pulse forming network, the old ones are still undergoing the transformation. This causes an interference effect inside the network, which means that the RF energy that comes out will be a combination of all of the pulses interfering with each other. This in turn means that the resultant frequency depends on the pulse separation and how often one is activating the switch with the laser pulses.

Thus, for example, assuming a 0.4 nanosecond pulse separation, the switch is activated multiple times at 0.4 ns intervals. This is equivalent to one frequency. On the other hand, with a 1.2 ns pulse separation, the switch is activated multiple times at 1.2 ns pulse intervals, resulting in a different frequency. In between there are impulse wave trains corresponding to 0.55, 0.65 and 0.8 ns pulse separations with correspondingly differing frequencies. Because the resulting pulses are interfering in different ways, the net RF output waveform generation is flexible. This is shown in FIG. 9, which is a frequency versus amplitude graph of waveforms having been generated by the above-mentioned pulse spacings. Here it can be seen that for 1.2 ns spacings, the frequency is approximately 0.75 GHz, whereas for 0.04 ns spacings the frequency is around 2 GHz.

Figure 11:
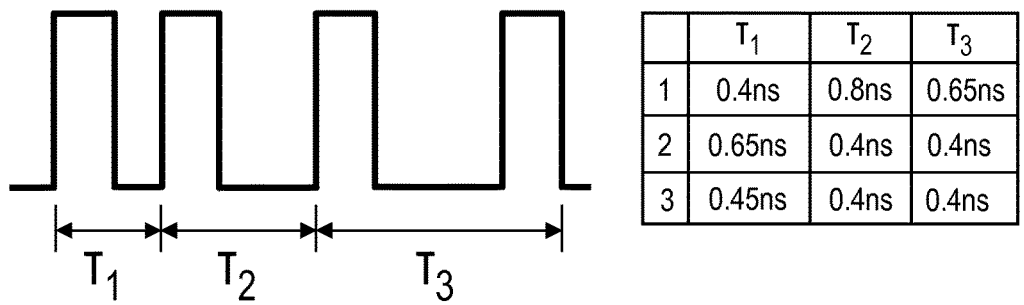
FIG. 11 is a waveform diagram for optical pulse delay showing three different interpulse spacings used in the generation of the waveforms of FIG. 10, in accordance with a first embodiment of the present disclosure.

FIG. 11 is a waveform diagram for optical pulse delay showing three different interpulse spacings used in the generation of the waveforms of FIG. 10, in accordance with a first embodiment of the present disclosure. Referring to FIGS. 10 and 11, what is depicted are three impulse waveforms corresponding to three different controlled delays between laser pulses used to activate the gallium nitride switch. Thus, for regular interpulse spacings, each of the three waveforms has a different characteristic frequency. As can be seen from FIG. 11, the interpulse spacings are denoted by three different delays τ1, 2 and 3 and can be made different at different times for the generation of each of the waveforms. Thus, not only can each of the waveforms be made to correspond to a different frequency corresponding to the interpulse delay, these interpulse delays can be made to vary during the pulse production to give even further flexibility for the construction of the RF waveform at the output.

Figure 12:
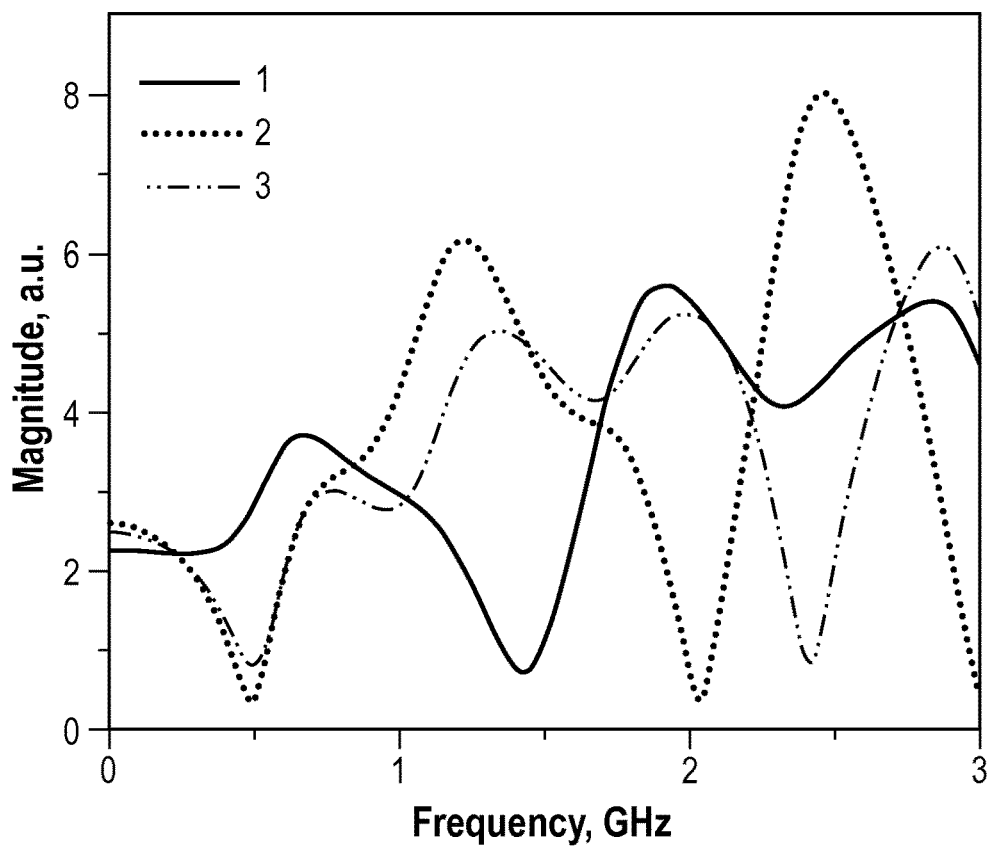
FIG. 12 is a graph showing frequency versus magnitude for the effective frequencies associated with the pulses of FIG. 10 based on the optical pulse control delays of FIG. 11, in which varying the laser pulse results in spectrums with controllable notches as well as a 1-3 GHz broadband spectrum, in accordance with a first embodiment of the present disclosure.

FIG. 12 is a graph showing frequency versus magnitude for the effective frequencies associated with the pulses of FIG. 10 based on the optical pulse control delays of FIG. 11, in which varying the laser pulse results in spectrums with controllable notches as well as a 1-3 GHz broadband spectrum, in accordance with a first embodiment of the present disclosure. The Table to the right of FIG. 11 shows that for the different waveforms 1, 2, and 3, producing the indicated waveform having the prescribed delays results in the combined output shown in FIG. 12 for each of these waveforms.

Here it can be seen that by varying these interpulse delays, this leads to a spectrum with controllable notches and a broad band spectral response from 1 to 3 GHz.

What has been described is that the new pulses enter the network while the old ones are still undergoing transformation. This causes an interference effect inside the network, such that what eventually comes out will be a combination of all of these pulses interfering with each other and with the frequency of that eventual full pulse that comes out depending on the separation and how often the switch is activated. Because the pulses are interfering in different ways in the pulse forming network, the frequency of the pulse that comes out is shifting and is a clear result of the utilization of the gallium nitride switch.

What is therefore described is the utilization of a gallium nitride photoconductive switch to be able to provide flexible, high power RF pulses through the utilization of a unique multi-pulse high repetition rate RF generator While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for generating high power pulsed variable-frequency RF waveforms, comprising the steps of:
   charging a transmission line in a pulse forming network with a single-polarity high-voltage source of 20 KV, said pulse forming network comprising a conductor connected through contacts of a single gallium nitride photoconductive switch to a ground, wherein multiple pulses from a single charge of said transmission line interfere with each other to produce said RF waveform; and,
   discharging the voltage on the transmission line to ground utilizing the single gallium nitride photoconductive switch, said single gallium nitride photoconductive switch comprising, in linear order, a first contact (38), an n+ epitaxial layer (36) in a first ohmic contact region, a GaN body (34), a p+ epitaxial layer (36) in a second ohmic contact region, and a second contact (40);
   wherein frequency of said high power pulsed RF waveform is controlled solely by modulation of pulses of laser radiation.

2. The method of claim 1, wherein the gallium nitride photoconductive switch is activated by laser pulses from a picosecond laser.

3. The method of claim 2, wherein said gallium nitride photoconductive switch is activated by laser pulses having a pulse width in a picosecond range.

4. The method of claim 3, wherein activation of the gallium nitride photoconductive switch by laser pulses forms multiple RF pulses.

5. The method of claim 4, wherein the multiple RF pulses from the picosecond laser have equal interpulse spacings.

6. The method of claim 4, wherein the multiple RF pulses from the picosecond laser have variable interpulse spacings; wherein said variable interpulse spacings of said multiple RF pulses comprise 0.4, 0.55, 0.65, 0.8 and 1.2 nanoseconds.

7. The method of claim 5, wherein, the charged transmission line is a parallel plate transmission line and is not significantly discharged through the gallium nitride photoconductive switch upon actuation thereof.

8. The method of claim 7, wherein picosecond laser pulses are delivered to the gallium nitride photoconductive switch and wherein the gallium nitride photoconductive switch is closed in at least one of a nanosecond and a picosecond time frame responsive to delivered picosecond laser pulses.

9. The method of claim 8, wherein the at least one nanosecond and picosecond time frame for the gallium nitride photoconductive switch closure permits rapid periodic discharging of the transmission line prior to the time that the energy stored in the transmission line has been depleted, thereby permitting the generation of rapid high power RF pulses.

10. The method of claim 9, wherein an effective operating frequency of the RF pulses generated is correlated to the interpulse spacings due to said interference of the pulses within the pulse forming network.

11. The method of claim 10, wherein the interpulse spacings are equal, and wherein the effective operating frequency is dependent upon the equal interpulse spacings, thereby permitting gigahertz operating frequencies;
   wherein a frequency of 2 GHz is produced by pulses spaced apart by 0.4 ns, and
   wherein a frequency of 750 MHz is produced by pulses spaced apart by 1.2 ns.

12. The method of claim 11, wherein the operating frequency is tuned by changing the interpulse spacings, whereby a large frequency tuning range of 750 MHz to 3 GHz is achieved.

13. The method of claim 10, wherein different interpulse spacings result in differing frequencies mixed in the pulse forming network to generate a waveform having flexible characteristics including the position of notches in the waveform characteristic.

14. The method of claim 13, wherein the RF waveform output is modulated by modulation of the laser.

15. A waveform flexible photoconductive switch-based high power variable-frequency RF pulse generator having a photoconductive switch with a sub-nanosecond response time, comprising:
- a single gallium nitride photoconductive switch, said single gallium nitride photoconductive switch comprising, in linear order, a first contact (38), an n+ epitaxial layer (36) in a first ohmic contact region, a GaN body (34), a p+ epitaxial layer (36) in a second ohmic contact region, and a second contact (40);
- a laser for activating said gallium nitride photoconductive switch;
- an RF pulse forming network including a coaxial transmission line connected to said gallium nitride photoconductive switch, wherein activation of the switch discharges said transmission line through a center conductor of said transmission line through said single gallium nitride photoconductive switch to ground, wherein multiple pulses from a single charge of said coaxial transmission line interfere with each other to produce said high power RF pulse; and
- a single polarity 20 kV high-voltage source coupled to said gallium nitride photoconductive switch;
- wherein frequency of said high power pulsed RF waveform is controlled solely by modulation of pulses of laser radiation.

16. The high power RF generator of claim 15, wherein said RF generator includes an antenna, and wherein said pulse forming network includes an impedance transformer between said transmission line and said antenna.

17. The high power RF generator of claim 15, wherein said laser produces multiple picosecond activation pulses and wherein said picosecond laser pulses result in nanosecond wide resulting RF pulses due to the sub-nanosecond response time of the gallium nitride photoconductive switch.

18. The high power RF generator of claim 17, wherein varying, by a laser modulator (15), the interpulse spacing of the multiple picosecond activation pulses changes a frequency of the output from said high power RF generator.

19. The high power RF generator of claim 18, wherein said pulse forming network includes a transformer and wherein frequency output of said high power RF generator can be changed without altering said transformer.

20. The high power RF generator of claim 18, wherein said interpulse spacing is tailored to provide high power RF pulses having variable frequency, power and repetition rate characteristics utilizing a single switching element.

21. The high power RF generator of claim 15, wherein a short carrier lifetime associated with the gallium nitride switch permits achieving high pulse repetition rates in the tens-to-hundreds of megahertz.

22. The high power RF generator of claim 15, wherein a short carrier lifetime associated with the gallium nitride switch permits generation of multiple RF pulses prior to the time that said transmission line is discharged.

23. The high power RF generator of claim 22, wherein the generation of multiple RF pulses prior to the time that said transmission line is discharged permits increasing an amount of energy on a target.

24. A waveform flexible photoconductive switch-based high power variable-frequency RF pulse generator having a photoconductive switch with a sub-nanosecond response time, comprising:
- a single gallium nitride photoconductive switch, said single gallium nitride photoconductive switch comprising, in linear order, a first contact (38), an n+ epitaxial layer (36) in a first ohmic contact region, a GaN body (34), a p+ epitaxial layer (36) in a second ohmic contact region, and a second contact (40);
- a laser for activating said gallium nitride photoconductive switch;
- an RF pulse forming network including a coaxial transmission line connected to said gallium nitride photoconductive switch, wherein activation of the switch discharges said transmission line through a center conductor of said transmission line through said single gallium nitride photoconductive switch to ground, wherein multiple pulses from a single charge of said coaxial transmission line interfere with each other to produce said high power RF pulse;
- a single polarity 20 kV high-voltage source coupled to said gallium nitride photoconductive switch;
- wherein frequency of said high power pulsed RF waveform is controlled solely by modulation of pulses of laser radiation; and
- wherein a short carrier lifetime associated with gallium nitride permits generation of pulse repetition rates that can match those associated with any target, provides gigahertz operational frequencies, and increases the tuning range of the high power RF generator by 2 to 3 times over that achievable utilizing a silicon switch, wherein the silicon switch closes for tens to hundreds of microseconds.

* * * * *